United States Patent
Canella

[19]

[11] Patent Number: 6,121,067
[45] Date of Patent: Sep. 19, 2000

[54] METHOD FOR ADDITIVE DE-MARKING OF PACKAGED INTEGRATED CIRCUITS AND RESULTING PACKAGES

[75] Inventor: Robert L. Canella, Meridian, Id.

[73] Assignee: Micron Electronics, Inc., Nampa, Id.

[21] Appl. No.: 09/017,260

[22] Filed: Feb. 2, 1998

[51] Int. Cl.⁷ .................................................. H01L 21/00
[52] U.S. Cl. .............................. 438/26; 438/22; 438/106; 438/107
[58] Field of Search .............................. 438/26, 107, 106, 438/22

[56] References Cited

U.S. PATENT DOCUMENTS

| | | |
|---|---|---|
| 3,751,587 | 8/1973 | Insler et al. . |
| 4,148,057 | 4/1979 | Jesse . |
| 4,375,025 | 2/1983 | Carlson . |
| 4,585,931 | 4/1986 | Duncan et al. . |
| 4,638,144 | 1/1987 | Latta, Jr. . |
| 4,707,722 | 11/1987 | Folk et al. . |
| 4,719,502 | 1/1988 | Ikeya et al. . |
| 4,753,863 | 6/1988 | Spanjer . |
| 4,861,620 | 8/1989 | Azuma et al. . |
| 4,945,204 | 7/1990 | Nakamura et al. . |
| 4,964,948 | 10/1990 | Reed . |
| 5,030,551 | 7/1991 | Herren et al. . |
| 5,157,412 | 10/1992 | Kleinschmidt et al. . |
| 5,206,280 | 4/1993 | Williams . |
| 5,262,470 | 11/1993 | Shimotsuma et al. . |
| 5,268,194 | 12/1993 | Kawakami et al. . |
| 5,302,553 | 4/1994 | Abbott et al. . |
| 5,329,090 | 7/1994 | Woelki et al. . |
| 5,346,802 | 9/1994 | Ohbachi et al. . |
| 5,348,033 | 9/1994 | Levit . |
| 5,357,077 | 10/1994 | Tsuruta . |
| 5,373,039 | 12/1994 | Sakai et al. . |
| 5,413,629 | 5/1995 | Yasui et al. . |
| 5,445,923 | 8/1995 | Takahashi et al. . |
| 5,493,801 | 2/1996 | James . |
| 5,741,361 | 4/1998 | McKinnon et al. . |
| 5,761,803 | 6/1998 | St. John et al. . |
| 5,817,541 | 10/1998 | Averkiou et al. ....................... 438/107 |
| 5,822,856 | 10/1998 | Bhatt et al. . |
| 5,887,345 | 3/1999 | Kulesza et al. . |

Primary Examiner—Kevin M. Picardat
Assistant Examiner—D. Mark Collins
Attorney, Agent, or Firm—Trask, Britt & Rossa

[57] ABSTRACT

A method for additively de-marking a packaged integrated circuit die bearing engraved marking indicia on an exterior surface thereof. The marked surface is covered with an overlayer of material to fill the engraved markings and provide a surface suitable for re-marking. The covering material may be applied in a flowable state by applicator contact or by non-contact dispensing, or may be applied as a preformed segment. The exterior surface to be covered may be pre-treated to enhance bonding of the covering material. The covering material may be bonded to the marked surface in a post-application curing operation. De-marked integrated circuit packages are also disclosed.

28 Claims, 3 Drawing Sheets

METHOD FOR ADDITIVE DE-MARKING OF PACKAGED INTEGRATED CIRCUITS AND RESULTING PACKAGES

RELATED APPLICATION

This application contains subject matter related to U.S. patent application Ser. No. 09/017,428 filed on even date herewith and entitled Apparatus for Additive De-Marking of Packaged Integrated Circuits, by the same inventor.

BACKGROUND OF THE INVENTION

The present invention relates generally to removal of markings from integrated circuit packages, and more specifically to de-marking laser-marked thin packages by covering the marked surface with a material suitable for re-marking, as well as to de-marked packages so fabricated.

It is known in the art to apply markings to surfaces of integrated circuits packaged in filled-polymer, transfer-molded packages as well as to other packages; such as preformed ceramic packages into which an integrated circuit (IC) die is inserted. Marking techniques known in the art include ink-marking, wherein a package surface is stamped or rolled with a wet ink mark, and laser marking, wherein a package surface receives identification indicia actually engraved therein with a laser beam. Ink marking is relatively slow, requires periodic changing of the applicator to change marking indicia as well as cleaning of the applicator as ink accumulates thereon, and requires drying of the ink after application. Further, ink marks may smudge or subsequently be abraded off of the package surface. As a consequence, use of laser marking is becoming more prevalent due to the speed of marking, the indelibility of the mark once applied, and the ability to readily change the marking indicia to be applied through a re-programming of the computer controlling movement of the laser beam or a mirror or mirrors reflecting same to the package surface. One particularly efficient laser-marking apparatus is disclosed in pending U.S. patent application Ser. No. 08/590,919, filed Jan. 24, 1996 by the present inventor and assigned to the assignee of the present invention.

Sometimes it becomes necessary to remove marks previously applied to an IC package. In the case of ink-marked IC packages, removal is relatively easily effected using solvents or a mild abrasive action which scrubs the package surface without removing package material. However, in the case of a laser-marked IC package, a preferred method of removal is abrasive removal, wherein a layer of package material is removed from the package surface to a depth sufficient to remove the engraved laser mark, and preferably in a manner to provide a reflective surface suitable for re-marking. Such a method and apparatus for effecting same is disclosed in co-pending U.S. patent applications Ser. Nos. 08/907,962 and 08/909,187, each filed Aug. 11, 1997 by the present inventor and Tony T. Ibarra and assigned to the assignee of the present invention.

There are some widely-employed, thin IC package configurations which are not, however, readily susceptible to abrasive engraved mark removal. In such configurations, the thickness of the package material between the marked package surface and a surface of the IC die within the package is insufficient to permit mark removal by a subtractive technique involving removal of package material to a depth at least equivalent to the bottoms of the engraved markings without compromising package integrity. Wire-bonded IC dice with wire loops extending above the active surface of the IC die and well into the package material present particular challenges to abrasive mark removal. In some extreme cases, the forces involved in abrasive removal will simply destroy the package and enclosed IC.

One such example of a thin plastic package configuration presenting the above-mentioned de-marking problem is a so-called Thin Small Outline Package, or TSOP. Another is a Thin Quad Flat Pack, or TQFP. Such packages are dimensioned with a total package thickness, excluding lead fingers, of less than about one-half the thickness of a plastic Small Outline J-lead package, or SOJ. In terms of actual filled-polymer package dimensions, a TSOP or TQFP plastic package may be less than 0.040 inch in thickness, leaving little or no margin for removal of package material above the active surface of the encased IC die.

Thus, when it is necessary or desirable to de-mark a thin, laser-marked plastic package without damage thereto and in a manner which will facilitate subsequent re-marking, the prior art is devoid of an adequate solution.

BRIEF SUMMARY OF THE INVENTION

The present invention includes a method for additively de-marking an IC package marked on an exterior surface thereof, as well as such de-marked IC packages.

One embodiment of the method includes dispensing an opaque covering material over an IC package surface bearing engraved markings, such as laser markings. The covering material may be, or be alterable as by application of heat to be, of sufficiently low viscosity to enter and fill the indentations in the package surface comprising the markings. The covering material may also be sufficiently wettable in its fluid state to the filled-polymer package material and with sufficiently low surface tension so as to spread evenly over the package surface without forming a meniscus at the peripheral edges of the surface and trapping an undesirable thickness of coating material thereon. The covering material may be indelible, i.e., permanent, under normal operating conditions to be encountered by the package, and bondable to the package surface after application as, by way of example, by thermal bonding or curing. After final bonding, the covering material may present a layer of sufficient thickness to withstand re-marking by laser without damage to the package or encapsulated die, as well as exhibiting an exposed surface of sufficient reflectivity to facilitate such re-marking.

The covering material may be dispensed in a fluid or gelled state onto the package surface by direct contact with a dispensing applicator such as a rotatable roller, an open-cell sponge element, or a brush. Alternatively, the covering material may be dispensed in a fluid state from a nozzle or other aperture of a non-contact applicator as a drop, stream or spray while the IC package is stationary thereunder, or as it moves past the applicator. A mask with an aperture sized to the marked package surface may also be used to prevent contamination of the package leads. Subsequent to application, the covering material may be cured to a permanent state bonded to the now-covered package surface by thermal curing effected by passage through an oven or under a heat surface such is an infra-red lamp.

A dam may be formed on the marked package surface, and a flowable liquid or gelled covering material dispensed onto the surface area contained within the dam perimeter. The dam may be sized to encompass the length and thickness of the package, or to rest partially or entirely on the marked package surface. If a dam is to be formed, it may be a preformed dam element applied to the IC package, or may be stenciled or extruded onto the IC package.

The covering material may also be applied as a preformed segment of material. For example, a powdered material maintained in segment shape by a volatile fluid binder may be applied from a dispensing tape carrying multiple segments, and then heated to fluidize the coating material, drive off the binder, and cause the covering material to solidify upon cooling into a layer bonded to the marked surface. Alternatively, the preformed material may comprise a tape segment severed from a tape of covering material and adhered to the marked surface. The adherence may be permanent upon application, or may be further enhanced by post-application curing.

Pre-treatment of the package surface to be covered, as by laser or flame spray, to enhance bonding of the subsequently-applied covering material thereto may also be effected in accordance with the invention.

DETAILED DESCRIPTION

Figure 1:
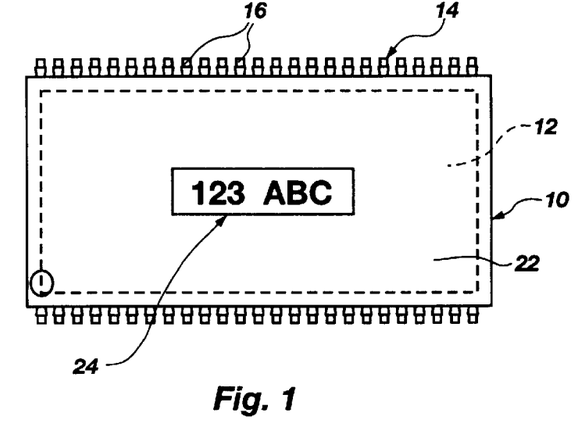
FIG. 1 is a top view of an exemplary thin IC package configured as a TSOP.
Figure 1A:
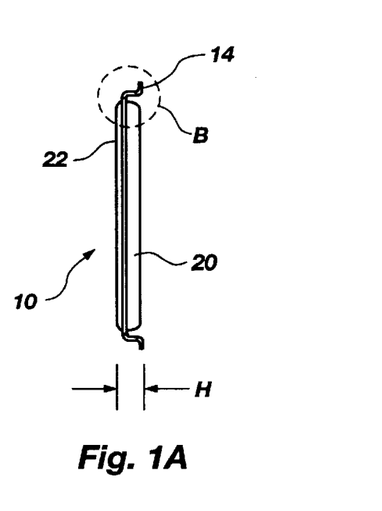
FIG. 1A is a side view of the package.
Figure 1B:
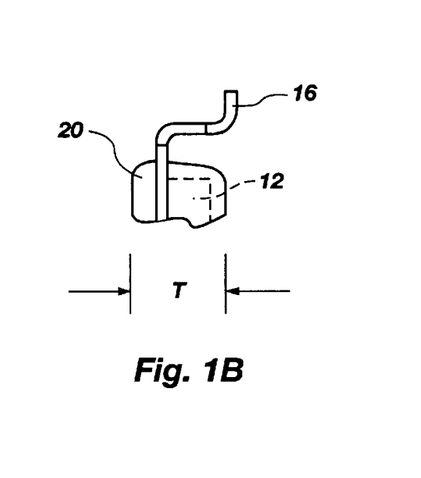
FIG. 1B is an enlargement of a portion of FIG. 1A located in the dotted circle B.

Referring now to FIGS. 1, 1A and 1B, an exemplary TSOP 10 is depicted in the form of a 50-pin Plastic TSOP sold by Micron Technology, Inc. of Boise, Id. Package 10 comprises a Dynamic Random Access Memory (DRAM) IC die 12 (shown in broken lines) mechanically attached and electrically connected to lead frame 14 having lead fingers 16 extending from the exterior of a transfer-molded, filled polymer package 20 (generally termed a "plastic package" in the art). The total height H of package 10 including lead fingers 16 is about 0.047 inch maximum, while the actual thickness T of the package 20 may range from about 0.039 to 0.045 inch, substantially less than ⅟₂₀ of an inch. Exterior surface 22 of package 20 has marking indicia represented by the numbers and letters enclosed by box 24 engraved thereon as by a laser marker, as known in the art. Such indicia may include, in actual practice, numbers, letters, symbols or logos, the type of indicia having no effect on the practice of the present invention. It will be readily appreciated by those of ordinary skill in the art that the thickness of packaging material above die 12 is unsuitable for abrasive de-marking, wherein a layer of packaging material is removed, as package integrity will almost certainly be compromised, if TSOP 10 is not destroyed outright.

Figure 2:
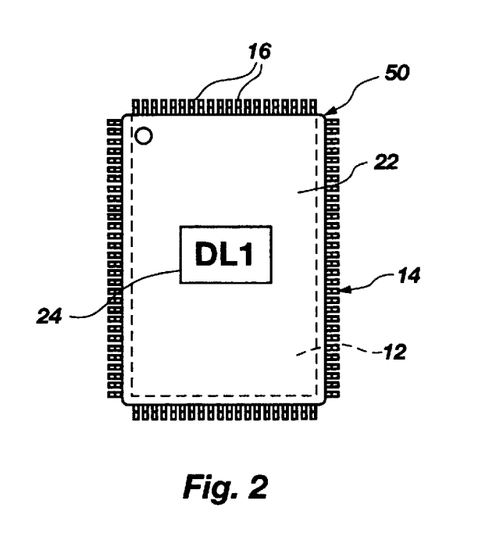
FIG. 2 is a top view of another exemplary thin IC package configured as a TQFP.

FIG. 2 depicts an exemplary TQFP 50 in the form of a 100-Pin Plastic TQFP sold by Micron Technology, Inc. of Boise, Id. For the sake of convenience, the same reference numerals have been used in FIG. 2 as in FIG. 1 to identify like components. While TQFP 50 employs a package thickness slightly exceeding that of TSOP 10, being on the order of about 0.053 to 0.057 inch, nonetheless, TQFP 50 also is unsuitable for abrasive de-marking due to the thin layer of protection afforded by the filled polymer package material.

Figure 3:
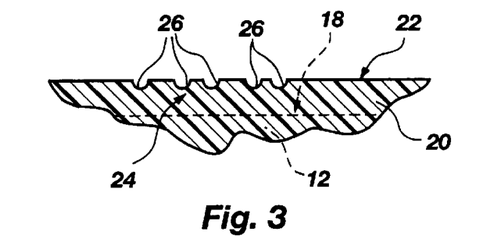
FIG. 3 is a greatly enlarged, side sectional view of a portion of a surface on the exterior of a filled-polymer IC package marked with engraved marking indicia.
Figure 4:
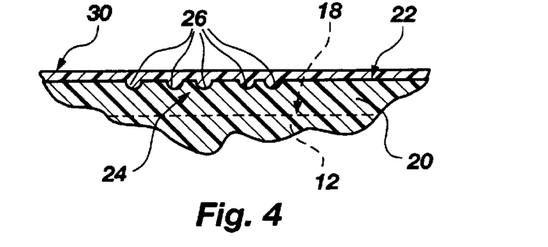
FIG. 4 is a greatly enlarged, side sectional view of the same surface depicted in FIG. 3, subsequent to additive de-marking in accordance with the present invention.

FIG. 3 depicts an enlarged side sectional view of a portion of surface 22 of TSOP 10. As can readily be seen, marking indicia 24 comprise recesses 26 burned in surface 22 in a selected pattern to define letters, numbers, symbols or logos, as desired. IC die 12 is illustrated below indicia 24 to indicate the close proximity of the active surface 18 of die 12 to the bottoms of the recesses 26. FIG. 4 depicts the same portion of surface 22, but additively de-marked by the application of a suitable covering material 30 thereto. Material 30 preferably comprises a dielectric material having sufficiently low viscosity to fill recesses 26 of marking indicia 24, wettable to the filled polymer package material so as to easily spread over marked exterior surface 22, and exhibiting sufficiently low surface tension so as to relax over surface 22 and not form a convex meniscus thereover, trapping too great a thickness of covering material 30 on surface 22. A preferable thickness for covering material 30 is between about 0.001 inch and about 0.005 inch. The covering material 30, in one embodiment, may be applied in a fluid state, and subsequently cured into a permanent solid state bonded to exterior surface 22. Suitable covering materials are offered under the HYSOL® trademark by The Dexter Corporation of Windsor, Conn., and more specifically by the Dexter Electronic Materials division of Industry, California. Depending upon the chosen manner of application, package material and the temperature requirements for the covering material in use on the IC package to which it is applied, the material may comprise, by way of example and not limitation, inter alia: a HYSOL® two-component heat cure epoxy such as an RE2039/EE4183 resin with an HD0242 hardener or an RE2039/EE4183 resin with an HD0243 hardener; a HYSOL® room temperature cure epoxy such as an RE2038/EE4143 resin or RE2039/EE4183 resin with an HD3404 hardener, an RE2039/EE4183 resin with an HD3561 hardener or a single-component epoxy such as ES4212, ES4312 or ES4412, a liquid encapsulant such as HYSOL® FP4510, FP 4511, FP4520, FP4526, or FP4527; a one-component epoxy or casting compound such as HYSOL® EO0104, EO0202, EO1016, EO1060, FP4322, FP4323, EO1070, FP4401 or FP4402, or a urethane such as HYSOL® US0028 or US0096. Other manufacturers offer additional suitable covering materials.

It is desirable that the covering material bond well to the marked surface to be covered. In that regard, the composition of the package material should be carefully considered in relation to the covering material to be employed, as silicon or wax residue on the package surface may reduce the capacity of some covering materials to bond adequately. It is contemplated, however, that laser or flame pre-treatment of the marked surface may reduce or effectively eliminate the undesirable effects of the wax or silicon presence.

Figure 5:
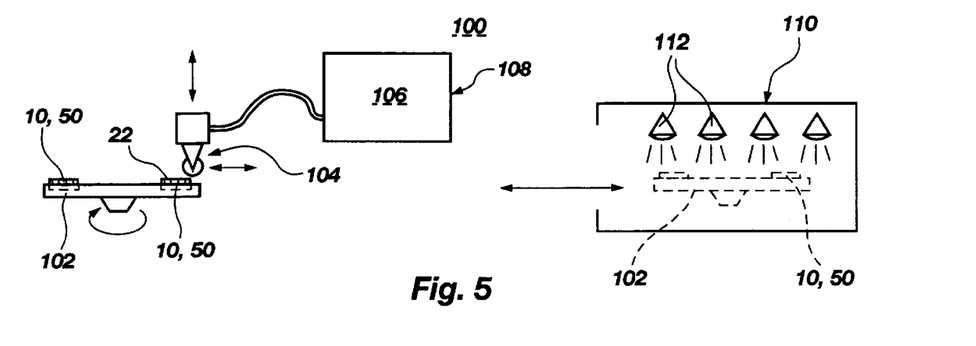
FIG. 5 is a schematic side view of one embodiment of an apparatus for additive de-marking in accordance with the present invention.

FIG. 5 depicts a first embodiment 100 of an additive de-marking apparatus according to the invention. Apparatus 100 includes a packaged IC handling device 102 for presenting an exemplary TSOP IC package 10 or TQFP package 50 for coating by contact applicator 104, which is provided with a covering material 106 from reservoir 108. As shown, handling device 102 may comprise a multi-cavity turntable as known in the art, or may also suitably comprise a multi-aperture platen holding a plurality of packages 10 or 50 for de-marking, or a track upon which packages 10 or 50 may travel past applicator 104. In operation, a package 10 or 50 is contacted on marked exterior surface 22 by applicator 104, optionally comprising a roller, stamp, open-cell sponge, brush, or other contact applicator configuration known in the art. Applicator 104 dispenses covering material 106 in the required quantity to coat at least a portion of surface 22 and especially to obscure the marking indicia (not shown) thereon. Subsequent to receiving a quantity of covering material 106, each package 10 or 50 may be moved while supported by handling device 102 to a curing station 110 for stabilization of the layer or coating of covering material 106 and bonding thereof to marked exterior surface 22. Curing may be effected by, for example, application of heat, or application of light or other electromagnetic radiation in a selected wavelength range from a source 112.

Figure 6:
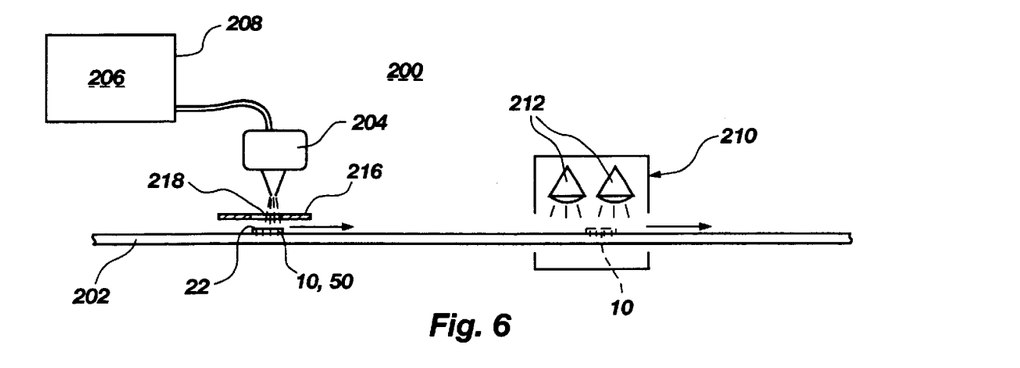
FIG. 6 is a schematic side view of another embodiment of an apparatus for additive de-marking in accordance with the present invention.

FIG. 6 depicts a second embodiment 200 of an additive de-marking apparatus according to the invention. Apparatus 200 includes a handling device 202, depicted as a track or belt conveyor, for presenting an exemplary TSOP package 10 (or, again, TQFP package 50) for covering of marked exterior surface 22 by non-contact applicator 204. Applicator 204 is provided with covering material 206 from reservoir 208. The applicator 204 may include a dispensing nozzle fed by a controlled, metered volume of covering material 206 from reservoir 208, such metering being effected by a metering pump or a valve, as known in the art. The nozzle may define a circular aperture to dispense a pool of covering material 206 on a central area of marked exterior surface 22 of package 10, or may define a slot, such as may be beneficially employed to cover a marked surface 22 moving at a controlled rate therepast in a direction transverse to the slot. A mask 216 having an aperture 218 therein may optionally be inserted between package 10 and applicator 204 to reduce the potential for excess covering material 206 falling onto the lead fingers of the package. After marked exterior surface 22 is coated, each package 10 may travel to a curing station 210 for stabilization of the coating and bonding thereof to marked exterior surface 22. As noted previously, curing may be effected by a suitable heat or electromagnetic radiation source 212. While it is also possible that applicator 204 may alternatively comprise an airless or air-driven sprayer, such devices present a significant potential for contamination of the package leads, may require enclosures or complex venting systems, and may also present metering and nozzle clogging problems.

Figure 7:
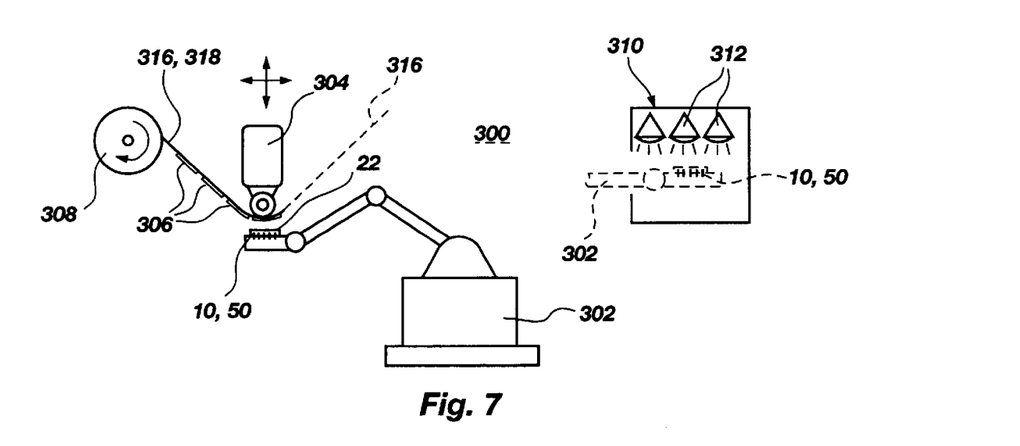
FIG. 7 is a schematic side view of a third embodiment of an apparatus for additive de-marking in accordance with the present invention.

FIG. 7 depicts a third embodiment 300 of an additive de-marking apparatus according to the invention. Apparatus 300 includes a handling device 302, depicted as a computer-controlled robotic arm, for presenting an exemplary TSOP package 10 or TQFP package 50 for coating of marked exterior surface 22 by applicator 304, depicted as a contact applicator for applying preformed segments of covering material 306. Segments of covering material 306 may comprise powdered material formed into rectangles with a volatile binder and carried on a reel-type reservoir 308 in the form of a carrier tape 316, or may comprise segments to be cut from a continuous length of covering material 306 formed as a self-supporting tape 318 and fed from reservoir 308. If a preformed segment 306 of powdered covering material is employed, it may be liquified and the binder driven off in a curing station 310 by application of heat from a source 312. If a preformed segment of tape-type covering material 306 is employed, it may securely bond by mere contact to marked exterior surface 22, or may merely form a preliminary "tack" bond with surface 22, such tack bond being subsequently made more robust by curing in station 310. Further, if a tape-type preformed segment is employed, the covering material 306 may be self-adhesive, or may be coated on one side with a separate adhesive which may exhibit a tacky adhesiveness to be subsequently strengthened by curing. Finally, a separate adhesive may be applied to marked exterior surface 22 prior to application of an adhesive-free tape-type segment of covering material 306 thereto, if that approach is preferred.

Figure 8:
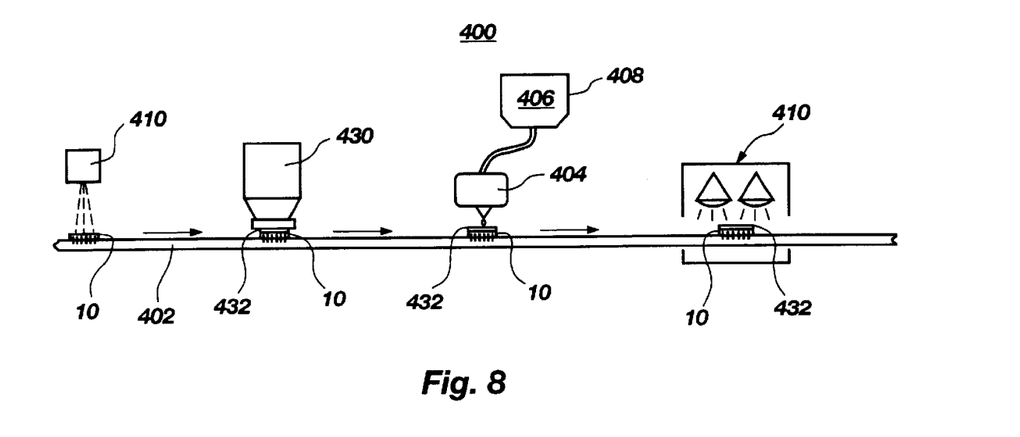
FIG. 8 is a schematic side elevation of a fourth embodiment of an apparatus for additive de-marking in accordance with the present invention.

FIG. 8 depicts a fourth embodiment 400 of an additive de-marking apparatus according to the invention. Apparatus 400 includes a packaged IC handling device 402, depicted as a track or belt conveyor, for presenting an exemplary TSOP package 10 or TQFP package 50 for covering at least a portion of marked exterior surface 22.

Figure 9A:
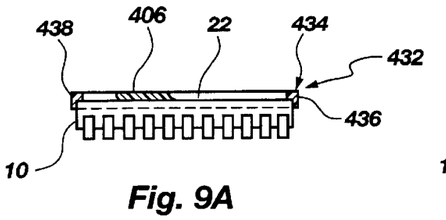
FIGS. 9A–9C are side, partial sectional elevations of an exemplary thin IC package showing alternative arrangements of dam elements employed to contain a covering material in flowable form as dispensed onto a marked surface of the IC package.
Figure 9B:
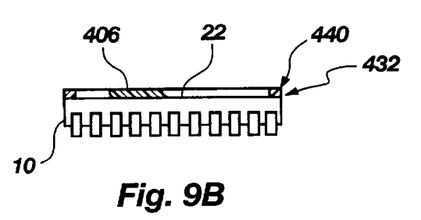
Figure 9C:
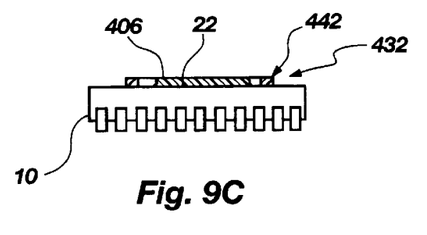

Prior to application of a covering material 406, however, a dam applicator 430 forms a dam structure 432 on or about marked surface 22 for containment of subsequently-applied covering material 406. With reference to FIGS. 9A–9C, and shown with respect to a schematically-depicted TSOP package 10, the dam structure 432 may comprise (see FIG. 9A) a peripheral dam element 434 (height exaggerated for clarity) which extends about the entire perimeter of a marked surface 22 of the IC package 10. Dam element 434 may include a skirt portion 436 extending down the side of a package and an inwardly-extending shoulder portion 438 resting on the peripheral edge of marked surface 22. Alternatively, the dam structure 432 may comprise (see FIG. 9B) a peripheral dam element 440 which rests entirely on marked surface 22, adhering thereto and encompassing the entire marked surface 22 inside of the inner wall of dam element 440. As a further alternative, the dam structure may comprise (see FIG. 9C) a smaller dam element 442 which is sized to only encompass the marked area of surface 22 to be covered; this latter alternative may be less preferred due to the precision of dam placement required and the absence of alignment features such as are provided by the edges of the marked surface 22 for placement of other embodiments of the dam structure.

The dam structure 432 may comprise a preformed plastic frame element dispensed from a tape or magazine, or cut from a series of linked frame elements, or may comprise a structure stenciled or extruded from a thermoplastic or thermosetting material onto marked surface 22. Exemplary suitable dam materials may include HYSOL® FP4450, FP4451 and FP 4460, with compatible covering materials including HYSOL® FP4457 and FP4650.

After the dam structure 432 is placed on a marked surface 22 of, for example, a package 10, package 10 is presented to applicator 404. Applicator 404 dispenses a flowable, preferably highly viscous covering material 406 from reservoir 408 onto marked surface 22 within the perimeter of a dam structure 432 thereon, such as the aforementioned dam element 434, 440 or 442. A portion of the layer of covering material 406 is shown in each of FIGS. 9A–9C. Covering material 406 is dispensed in a controlled, metered volume so as to fill engraved markings on surface 22 and to preferably cover marked surface 22 to a uniform depth, which may be substantially the same as the wall height of the dam structure above the marked surface 22. The covering material may then be cured at a curing station 410 having heat or electromagnetic radiation source 412, as previously described, if required or desired to speed solidification of the covering material 406 or bonding to the marked surface 22.

While the invention has been described in terms of certain illustrated embodiments, those of ordinary skill in the art will understand and appreciate that it is not so limited, and that many additions, deletions and modifications to the invention as disclosed herein may be effected without departing from the scope of the invention as hereinafter claimed.

What is claimed is:

1. A method of de-marking an IC package, comprising:
    providing an IC package including marking indicia on an exterior surface thereof; and
    covering the marking indicia with a material to obscure the marking indicia.

2. The method of claim 1, wherein covering the marking indicia further comprises covering substantially the entire exterior surface including the marking indicia with the material.

3. The method of claim 2, wherein covering the marking indicia further comprises producing a surface over the covered marking indicia suitable for re-marking.

4. The method of claim 1, wherein covering the marking indicia further comprises applying the material in a thickness sufficient to provide an opaque layer of material over the marking indicia.

5. The method of claim 1, wherein the marking indicia comprise indicia defined by recesses engraved into the exterior surface of the IC package, and wherein covering the marking indicia further comprises applying the material in a fluid state to cause the material to substantially fill the engraved recesses in the exterior surface.

6. The method of claim 5, wherein covering the marking indicia further comprises covering substantially the entire exterior surface including the marking indicia with the material.

7. The method of claim 1, wherein covering the marking indicia further comprises applying the material to the exterior surface including the marking indicia in a fluid state.

8. The method of claim 7, wherein covering the marking indicia further comprises curing the applied material to a solid state subsequent to application.

9. The method of claim 8, wherein said curing is effected at least in part by applying heat to the material.

10. The method of claim 9, wherein said curing is effected at least in part by subjecting the material to electromagnetic radiation within a selected wavelength range.

11. The method of claim 1, wherein covering the marking indicia comprises applying the material in a fluid state by contact of an applicator with the exterior surface including the marking indicia.

12. The method of claim 1, wherein covering the marking indicia comprises applying the material in a fluid state by non-contact dispensing of the material onto the exterior surface including the marking indicia.

13. The method of claim 12, wherein non-contact dispensing comprises controlled dispensing of a volume of the material.

14. The method of claim 1, wherein covering the marking indicia comprises applying the material to the exterior surface including the marking indicia in the form of a preformed segment of material in a size and shape substantially the same as that of the exterior surface.

15. The method of claim 14, further comprising adhering the preformed segment to the exterior surface including the marking indicia.

16. The method of claim 15, further comprising applying an adhesive to the preformed segment prior to application of the preformed segment to the exterior surface including the marking indicia.

17. The method of claim 15, further comprising applying an adhesive to the exterior surface including the marking indicia prior to application of the preformed segment thereto.

18. The method of claim 15, wherein adhering is effected by curing the preformed segment to bond the segment to the exterior surface.

19. The method of claim 14, further comprising forming the preformed segment of material as a solid segment.

20. The method of claim 19, further comprising forming the solid segment by severing the solid segment from an elongated tape of the material.

21. The method of claim 19, further comprising forming the solid segment of particles of the material consolidated by a binder.

22. The method of claim 1, further comprising pretreating at least a portion of the exterior surface including the marking indicia to enhance bonding of the material thereto.

23. The method of claim 1, further comprising forming a dam structure defining a perimeter about at least a portion of the exterior surface bearing said marking indicia, and covering the marking indicia comprises dispensing the material onto the exterior surface within the dam perimeter in a flowable state.

24. The method of claim 23, wherein forming the dam structure comprises placing a preformed dam element on the IC package.

25. The method of claim 23, wherein forming the dam structure comprises forming a dam element in place on the IC package.

26. A de-marked IC package comprising an IC die encapsulated in a package bearing engraved marking indicia on an exterior surface thereof covered by a layer of material, formed by the method comprising:
    applying the layer of material over the engraved marking indicia in a volume sufficient to obscure the engraving marking indicia.

27. The de-marked IC package of claim 26, wherein said applying said layer of material comprises dispensing the material in a flowable state onto the exterior surface in a volume sufficient to fill the engraved marking indicia.

28. The de-marked IC package of claim 26, wherein said applying said layer of material comprises applying a preformed segment of the material to the exterior surface at least over the engraved marking indicia.

* * * * *

UNITED STATES PATENT AND TRADEMARK OFFICE
CERTIFICATE OF CORRECTION

PATENT NO. : 6,121,067
DATED : September 19, 2000
INVENTOR(S) : Canella

Page 1 of 4

It is certified that error appears in the above-identified patent and that said Letters Patent is hereby corrected as shown below:

Column 1,
Line 15, after "packages" delete "," and after "and" insert -- , --;
Lines 15-16, after "specifically" insert -- , --;
Line 21, after "packages" (1st occurrence) insert -- , --; and after "packages" (2nd occurrence) delete -- ; --;
Line 22, after "packages" insert -- , --;
Line 29, after "indicia" insert -- , --;

Column 2,
Line 33, change "with" to -- have --;
Line 52, after "spray" insert -- , --;
Line 59, change "infra-red" to -- infrared --;

Column 3,
Line 53, change "Plastic" to -- plastic --;
Line 54, change "Package" to -- TSOP --;
Line 60, change "package 10" to -- TSOP 10, --;
Line 61, after "fingers 16" insert -- , --;

Column 4,
Line 4, after "above" insert -- IC --;
Line 9, change "100-Pin Plastic" to -- 100-pin plastic --;
Line 14, change "also is" to -- is also --;
Line 18, change "readily be" to -- be readily --; and change "surface 22" to -- exterior surface 22 --;
Line 19, change "surface 22" to -- exterior surface 22 --;
Line 21, change "indicia 24" to -- marking indicia 24 --;
Line 22, change "die" to -- IC die --;
Line 24, change "surface 22" to -- exterior surface 22 --;
Lines 25-26, change "Material" to -- Covering material --;
Line 31, change "surface 22" to -- exterior surface 22 --;
Line 33, change "surface 22" to -- exterior surface 22 --;
Line 39-40, after "specifically" insert -- , --;
Line 53, change "FP 4511" to -- FP4511 --;
Line 56, change "FP4322, FP4323" to -- FP4322, FP4323 --;

UNITED STATES PATENT AND TRADEMARK OFFICE
CERTIFICATE OF CORRECTION

PATENT NO. : 6,121,067
DATED : September 19, 2000
INVENTOR(S) : Canella

It is certified that error appears in the above-identified patent and that said Letters Patent is hereby corrected as shown below:

Column 5,
Line 1, delete "100";
Line 2, after "apparatus" (1st occurrence) insert -- 100 --;
Line 8, after "turntable" insert -- , --;
Line 11, after "past" insert -- contact --;
Line 12, after "by" insert -- contact --;
Line 15, change "Applicator" to -- Contact applicator --;
Line 16, change "surface 22" to -- marked exterior surface 22 --;
Line 26, delete "200";
Line 27, after "apparatus" (1st occurrence) insert -- 200 --;
Lines 31-32, change "Applicator" to -- Non-contact applicator --;
Line 33, after "The" insert -- non-contact --;
Line 39, change "package 10" to -- TSOP 10 --;
Line 40, change "surface 22" to -- exterior surface 22 --;
Line 43, change "package 10" to -- TSOP 10 --;
Lines 43-44, change "applicator" to -- non-contact applicator --;
Line 46, change "package 10" to -- TSOP 10 --;
Line 51, change "applicator" to -- non-contact applicator --;
Line 56, delete "300";
Line 57, after "apparatus" (1st occurrence) insert -- 300 --;

Column 6,
Line 2, delete "306";
Line 3, after "material" insert -- 306 --;
Line 8, change "surface 22" to -- marked exterior surface 22 --;
Line 12, after "adhesive" insert -- , --;
Line 18, delete "400";
Line 19, after "apparatus" (1st occurrence) insert -- 400 --;
Line 26, change "surface 22" to -- exterior surface 22 --;

UNITED STATES PATENT AND TRADEMARK OFFICE
CERTIFICATE OF CORRECTION

PATENT NO.   : 6,121,067
DATED        : September 19, 2000
INVENTOR(S)  : Canella It is certified that error appears in the above-identified patent and that said Letters Patent is hereby corrected as shown below:

Line 32, change "surface 22" to -- exterior surface 22 --; and change "IC package" to -- TSOP --;
Line 35, change "surface 22" to -- exterior surface 22 --;
Line 38, change "surface 22" to -- exterior surface 22 --;
Line 39, change "surface 22" to -- exterior surface 22 --;
Line 41, after "which" insert -- , --;
Line 42, change "surface 22" to -- marked exterior surface 22 --;
Line 46, change "surface 22" to -- marked exterior surface 22 --;
Line 52, change "surface 22" to -- marked exterior surface 22 --;
Line 56, change "surface" to -- exterior surface --;
Line 57, change "package 10, package 10" to -- TSOP 10, TSOP 10 --;
Line 60, change "surface 22" to -- exterior surface 22 --;
Line 65, change "surface 22" to -- marked exterior surface 22 --;
Line 66, change "surface 22" to -- exterior surface 22 --;

Column 7,
Line 1, change "surface 22" to -- exterior surface 22 --;
Line 4, after "desired" insert -- , --; and
Line 5, change "surface 22" to -- exterior surface 22 --;

Column 7, claim 4,
Line 28, after "layer of" insert -- the --;

Column 8, claim 15,
Line 7, after "segment" insert -- of material --;

Column 8, claim 16,
Line 10, after "segment" insert -- of material --;
Line 11, after "segment" insert -- of material --;

UNITED STATES PATENT AND TRADEMARK OFFICE
CERTIFICATE OF CORRECTION

PATENT NO. : 6,121,067
DATED : September 19, 2000
INVENTOR(S) : Canella

It is certified that error appears in the above-identified patent and that said Letters Patent is hereby corrected as shown below:

Column 8, claim 17,
Line 15, after "segment" insert -- of material --;

Column 8, claim 18,
Line 18, after "segment" insert -- of material --;

Column 8, claim 23,
Line 35, delete "dam" and after "perimeter" insert -- of the dam structure --; and Column 8, claim 26,
Line 48, change "engraving" to -- engraved --.

Signed and Sealed this

Nineteenth Day of February, 2002

Attest:

JAMES E. ROGAN
*Attesting Officer*   *Director of the United States Patent and Trademark Office*